United States Patent [19]
Arimoto

[11] Patent Number: 5,523,613
[45] Date of Patent: Jun. 4, 1996

[54] BAND GAP REFERENCE POWER SUPPLY DEVICE

[75] Inventor: Masao Arimoto, Itami, Japan

[73] Assignee: Mitsubishi Denki Kabushiki Kaisha, Tokyo, Japan

[21] Appl. No.: 383,840

[22] Filed: Feb. 6, 1995

[30] Foreign Application Priority Data

Mar. 22, 1994 [JP] Japan .................................. 6-050534

[51] Int. Cl.$^6$ .................................................. H01L 27/10
[52] U.S. Cl. ........................ 257/563; 257/560; 257/564; 257/579; 257/566
[58] Field of Search ....................... 257/563, 560, 257/564, 578, 579, 566

[56] References Cited

U.S. PATENT DOCUMENTS 4,136,354  1/1979  Dobkin .................... 257/470
4,255,674  3/1981  Grenier et al. ............ 257/563

Primary Examiner—Robert P. Limanek
Assistant Examiner—David B. Hardy
Attorney, Agent, or Firm—Oblon, Spivak, McClelland, Maier & Neustadt

[57] ABSTRACT

A semiconductor device implemented using a transistor (Q1) including at least one emitter (E1) and a transistor (Q2) which is larger than the transistor (Q1) including n emitters (E21 to E2n) each having the same area as the emitter (E1) of the transistor (Q1). The emitter (E1) of the transistor (Q1) is disposed between the emitters (E21 to E2n) of the transistor (Q2). When there is deflection of a substrate due to a stress to cause distortion in shape of the emitters, the emitter (E1) has much less distortion in shape than the emitters located on the end portions of the row region in the longitudinal direction. Since the transistor (Q2) has a number of emitters, the distortion in shape of the emitters (E21 to E2n) of the transistor (Q2), if any, has little effect on the whole.

12 Claims, 12 Drawing Sheets

BAND GAP REFERENCE POWER SUPPLY DEVICE

BACKGROUND OF THE INVENTION

1. Field of the Invention

The present invention relates to a semiconductor device and a band gap reference power supply utilizing the same.

2. Description of the Background Art

In obtaining a reference voltage with high stability and small variation against temperature in a semiconductor integrated circuit, a circuit system called "band gap reference power supply" employing a bipolar transistor is often used. The band gap reference power supply circuit, which has been introduced by R. J. Widlar in 1971 ("New Developments in IC Voltage Regulators" R. J. Widlar, IEEE J. Solid-State Circuits, SC-6, 2-7 (February, 1971)) utilizes the physical characteristics of base-emitter voltage of a silicon transistor when biased in the forward direction as shown in FIGS. 8 and 9. In general, a temperature coefficient of the base-emitter voltage of a transistor is about $-2$ mV/°C., and then the base-emitter voltage is about 1.2 V in absolute zero point, which is almost equal to a band gap voltage (energy gap, 1.12 V when Ta=300° K.). Adding a voltage proportional to the absolute temperature to the base-emitter voltage of the transistor makes an output voltage of the band gap reference power supply. It is possible to make the temperature coefficient almost zero by controlling the voltage to be added so that the output voltage should be 1.2 V, thereby obtaining an output voltage with extremely small temperature dependency. Such a system is called "band gap reference power supply".

[The First Background Art]

The band gap reference power supply using a bipolar structure obtains the required characteristics without extra technique. FIG. 8 illustrates the first background art of a basic circuit of the band gap reference power supply using the bipolar transistor. In general, the relation between a base-emitter voltage $V_{BE}$ and an emitter current $I_E$ is expressed as follows:

$$V_{BE} = \frac{kT}{q} \ln\left(\frac{I_E}{I_S} + 1\right) \approx \frac{kT}{q} \ln\frac{I_E}{I_S} \quad (1)$$

where K, T, g and $I_s$ represent Boltzman's constant, absolute temperature, electrical charge and reverse saturation current, respectively. In FIG. 8, when the emitter area ratio between the transistors Q1 and Q2 is 1:n, base-emitter voltages $V_{BE1}$ and $V_{BE2}$ of the transistors Q1 and Q2 are expressed by using emitter currents $I_{E1}$, $I_{E2}$ and a reverse saturation current $I_{S1}$ of the transistor Q1 as follows:

$$V_{BE1} = \frac{kT}{q} \ln\frac{I_{E1}}{I_{S1}} \quad (2)$$

$$V_{BE2} = \frac{kT}{q} \ln\frac{I_{E2}}{nI_{S1}}$$

Assuming that voltages across resistors R1 and R2 are $V_{R1}$ and $V_{R2}$, respectively, the following relations are hold:

$$V_{R1}=V_{OUT}-V_{BE1}=R1 \cdot I_{E1}$$

$$V_{R2}=V_{OUT}-V_{BE3}=R2 \cdot I_{E2} \quad (3)$$

When the base-emitter voltage $V_{BE1}$ of the transistor Q1 is almost equal to a base-emitter voltage $V_{BE3}$ of a transistor Q3 regardless of a base current, the following equation is obtained:

$$R1 \cdot I_{E1} = R2 \cdot V_{E2} \quad (4)$$

Since a voltage $V_{R3}$ across a resistor R3 is equal to a voltage difference $\Delta V_{BE}$ ($=V_{BE1}-V_{BE2}$) between the base-emitter voltages of the transistors Q1 and Q2, the following relation is hold:

$$V_{R3} = R3 \cdot I_{E2} = \Delta V_{BE} = V_{BE1} - V_{VE2} \quad (5)$$

$$= \frac{kT}{q} \ln\left(n \cdot \frac{I_{E1}}{I_{E2}}\right) = \frac{kT}{q} \ln\left(n \cdot \frac{R2}{R1}\right)$$

Accordingly, the following equation is obtained:

$$V_{OUT} = R2 \cdot I_{E2} + V_{BE3} \quad (6)$$

$$= \frac{R2}{R3} \cdot \frac{kT}{q} \ln\left(n \cdot \frac{R2}{R1}\right) + V_{BE3}$$

The first term of Formula (6) is proportional to the absolute temperature.

[The Second Background Art]

FIG. 9 illustrates a circuit configuration of the second background art of the band gap reference power supply. In FIG. 9, when the emitter area ratio between the transistors Q1 and Q2 is 1:n, the voltages $V_{R1}$ and $V_{R2}$ across the resistors R1 and R2 are expressed as follows:

$$V_{R1}=R1 \cdot I_{E1}=V_{OUT}-V_{BE1}$$

$$V_{R2}=R2 \cdot I_{E2}=V_{OUT}-(V_{BE2}+R3 \cdot I_{E3}) \quad (7)$$

The voltages $V_{R1}$ and $V_{R2}$ are an inverted input $V(-)$ and a non-inverted input $V(+)$, respectively, of an operational amplifier A1 (input means). Therefore, assuming that the amplification factor of the operational amplifier A1 is $A_V$, the relation is expressed as follows:

$$V_{OUT}=A_V\{V(+)-V(-)\}=A_V(R2 \cdot I_{E2}-R1 \cdot I_{E1})$$

$$\therefore R1 \cdot I_{E1}=A_V(R2 \cdot I_{E2}-R1 \cdot I_{E2})-V_{BE1} \quad (8)$$

The amplification factor $A_V$ is infinity ($\infty$), and then the relation is expressed as follows:

$$R1 \cdot I_{E1} = R2 \cdot I_{E2} \quad (9)$$

$$\therefore V_{OUT} - V_{BE1} = V_{OUT} - (V_{BE2} + R3 \cdot I_{E2})$$

$$R3 \cdot I_{E2} = V_{BE1} - V_{BE2} = \frac{kT}{q} \ln\left(n \cdot \frac{R2}{R1}\right)$$

Accordingly, the following equation is obtained:

$$V_{OUT} = R1 \cdot I_{E1} + V_{BE1} \quad (10)$$

$$= \frac{R2}{R3} \cdot \frac{kT}{q} \ln\left(n \cdot \frac{R2}{R1}\right) + V_{BE1}$$

The first term of Formula (10) is proportional to the absolute temperature. In the background arts as mentioned above, the emitter area ratio 1:n between the transistors Q1 and Q2 as well as the resistances of the resistors R1, R2 and R3 are crucial determinants for the output voltage $V_{OUT}$. Accordingly, it is an important task to achieve the emitter area ratio between the transistors Q1 and Q2 with high accuracy. The first and second background arts comprise a bipolar transistor Q1 and a bipolar transistor including n bipolar transistors Q21 to Q2n each having the same shape as the bipolar transistor Q1, connected in parallel with one another, as shown in FIG. 10, so that the area accuracy of each transistor should become higher. In FIG. 10, E1, B1 and C1 represent the emitter, base and collector of the transistor Q1, E21 to E2n, B21 to B2n and C21 to C2n represent the emitters, bases and collector terminals of the transistors Q21 to Q2n and W1 and W21 to W2n represent wells (island-shaped regions) which function as collector regions of the transistor Q1 and Q21 to Q2n, respectively.

FIG. 11 is a sectional view of a CMOS configuration which is an example of non-bipolar configuration. As shown in FIG. 11, the CMOS 5 comprises an N-channel MOS 6 and a P-channel MOS 7. When an n⁻-type semiconductor layer 1 is used as a substrate, the n⁻-type semiconductor layer 1, a p⁻-type diffused layer 2 which functions as a well and n⁺-type diffused regions 3 to form a source (S) and a drain (D) are layered in the N-channel MOS 6. In the P-channel MOS 7, the n⁻-type semiconductor layer 1 and p⁺-type diffused regions 8 to form a source (S) and a drain (D) are layered. The band gap reference power supply having the above configuration, as can be seen from the transistors Q1 and Q2 of FIG. 11, uses a parasitic transistor (artificial bipolar transistor) in which the n⁻-type semiconductor layer 1, the p⁻-type diffused layer 2 and the n⁺-type diffused region 3 serve as collector, base and emitter, respectively. The triple-layered N-channel MOS 6 has an advantage in terms of manufacturing cost that the artificial bipolar transistors Q1 and Q2 of triple-layered configuration are formed simultaneously in a manufacturing process of the N-channel MOS 6. The configuration of FIG. 11 is used only for an emitter follower circuit since the n⁻-type semiconductor layer 1 is used as a collector in common.

In the first background art of FIG. 8, since the resistors R1 and R2 are disposed between the transistors Q1 and Q2, the transistors Q1 and Q2 do not have a common collector. Therefore the circuit of FIG. 8 cannot be of CMOS configuration but of bipolar configuration. On the other hand, in the second background art of FIG. 9, the transistors Q1 and Q2 have a common collector, so that the circuit of FIG. 9 can be of CMOS configuration as shown in FIG. 11 as well as of bipolar configuration.

In the circuit configurations shown in FIGS. 8 and 9, as clearly seen from the above Formulae, the accuracy in the voltage difference $\Delta V_{BE}$ between the base-emitter voltages of the transistors Q1 and Q2 is of extreme importance. In the first background art, the voltage difference $\Delta V_{BE}$ between the base-emitter voltages depends not only on the transistor characteristics but also the resistors R1 and R2, while in the second background art, it depends only on the transistor characteristics. In other words, in the second background art, controlling of the emitter areas of the transistors Q1 and Q2 has a significant effect on the whole circuit characteristics.

FIG. 12 is a plan view showing a layout of the CMOS 5 corresponding to the circuit diagram of FIG. 9. Reference signs E1 and E2 denote emitters of the transistors Q1 and Q2, respectively. Reference sign B denotes a common base of the transistors Q1 and Q2 which functions as a well and reference sign C denotes a common collector of the transistors Q1 and Q2 which functions a substrate. The area ratio between emitters E1 and E2 (emitter area ratio) is set to 1:n so as to obtain the predetermined base-emitter voltage difference $\Delta V_{BE}$.

In the configuration of FIG. 11, the emitters E1 and E2 are the n⁺-type diffused regions 3 and the areas thereof are determined only in diffusion process. It is very difficult to obtain a diffusion area with high accuracy and therefore there is high possibility of great error in its accuracy. As mentioned above, since the emitter area ratio has a significant effect on the electrical characteristics of the band gap reference power supply, the error in the emitter area ratio due to the error in diffusion area may cause a fatal flaw of the band gap reference power supply.

In general, when a well, a diffused region and the like are formed on a substrate, a stress is generated due to a difference of physical constant between the substrate and the well or between the well and the diffused region. The stress causes deflection in the substrate and thereby distortion is likely to occur in the shape of the diffused region located on the end portions. When emitters E1 and E2 are aligned transversely in a common well B as shown in FIG. 12, the emitter E1 of the transistor Q1 and the end portion of the emitter E2 of the transistor Q2 have distortion in their shape. In this case, the emitters E1 and E2 have the almost same distortion, and the distortion in area of the emitter E1 which is smaller is not negligible relatively to the area on design. Therefore, there is a possibility of bringing a great error in area ratio of the emitters E1 and E2. Thus, there is a problem that it is difficult to obtain a desired emitter area ratio (1:n) between the transistors Q1 and Q2 with high accuracy because of the area error of the emitter E1.

SUMMARY OF THE INVENTION

According to the present invention, a semiconductor device comprises: a first semiconductor layer of a first conductivity type having a major surface; a first semiconductor element provided on the major surface of the first semiconductor layer; and a second semiconductor element provided adjacent to the first semiconductor element on the major surface of the first semiconductor layer. The first semiconductor element includes at least one second semiconductor layer of a second conductivity type having a major surface formed on the major surface of the first semiconductor layer; and at least one third semiconductor layer of the first conductivity type formed by diffusion at a predetermined region on the major surface of the second semiconductor layer. The second semiconductor element includes a plurality of fourth semiconductor layers of the first conductivity type formed by diffusion at a predetermined region on the major surface of the second semiconductor layer. The third semiconductor layer and the plurality of fourth semiconductor layers are spaced with one another in at least one row region. A total area of the plurality of fourth semiconductor layers is larger than a total area of the at least one third semiconductor layer. The third semiconductor layer is disposed between the plurality of fourth semiconductor layers.

In the semiconductor device according to the present invention, since the third semiconductor layer of the first semiconductor element is not located on either end portion of the row region in the longitudinal direction, the third semiconductor layer has less distortion in its shape if there is deflection of the first semiconductor layer due to a stress to cause distortion in shape of the semiconductor layers located on both end portions. Moreover, since the total area of the fourth semiconductor layers is larger than that of the third semiconductor layer, the distortion in shape of the fourth semiconductor layers, if any, have less effect than the distortion in shape of the third semiconductor layer. Therefore, the area ratio between the third and fourth semiconductor layers has much less error.

For example, in the band gap reference power supply utilizing the semiconductor device, a band gap reference potential is achieved with high accuracy when it is determined by the area ratio between the third and fourth semiconductor layers.

Preferably, each of the plurality of fourth semiconductor layers has the same shape and area as the third semiconductor layer.

The third and fourth semiconductor layers all of which are formed by diffusion have difficulty in obtaining the same area exactly as designed because of diffusion time and environmental conditions including temperature and humidity. In the semiconductor device according to the present invention, since the plurality of fourth semiconductor layers are formed separately and each of them has the same shape and area as the third semiconductor layer, the third and fourth semiconductor layers have equal errors in their diffusion area if they have any. Therefore, it is possible to prevent the area ratio error between the third and fourth semiconductor layers, and to achieve the area ratio between the third and fourth semiconductor layers with higher accuracy.

Preferably, the number of the plurality of fourth semiconductor layers is three times as large as the number of the at least one third semiconductor layer or more.

In the semiconductor device according to the present invention, by preventing distortion in shape of the third semiconductor layer, there is inevitable distortion in shape of the fourth semiconductor layers. Since the number of the fourth semiconductor layers is three times as large as the number of the at least one third semiconductor layer or more and accordingly the total area of the fourth semiconductor layers is three times as large as the total area of the at least one third semiconductor layer or more, the distortion area of the fourth semiconductor layers, if any, forms lower proportion of the total area thereof. Therefore, it is possible to achieve the area ratio between the third and fourth semiconductor layers with high accuracy.

Preferably, the third semiconductor layer is disposed between two halves of the plurality of fourth semiconductor layers.

Since the third semiconductor layer is located in the middle portion of the row region away from the end portions, the third semiconductor layer has much less distortion in shape if the first semiconductor layer has deflection due to the stress.

Preferably, the at least one row region includes a plurality of row regions.

In the semiconductor device according to the present invention, when the corresponding semiconductor layers across the plurality of row regions are connected, the third and fourth semiconductor layers of larger areas are obtained, and internal resistances are lowered in applying a current to the semiconductor layers of the semiconductor elements since the internal resistances are as if connected in parallel. Accordingly, the power consumption is lowered.

Preferably, the at least one second semiconductor layer includes a plurality of second semiconductor layers and each of the plurality of second semiconductor layers is provided independently corresponding to the third semiconductor layer or each of the plurality of fourth semiconductor layers. Furthermore, the plurality of second semiconductor layers are of the same shape and area.

When there is deflection of the first semiconductor layer due to the stress, there occurs thereby distortion in shape of the second semiconductor layer provided on the major surface of the first semiconductor layer to further cause distortion in shape of the third and fourth semiconductor layers. In the semiconductor device according to the present invention, since the plurality of second semiconductor layers of the same shape and area are each formed independently corresponding to each of the third or fourth semiconductor layers, the third and fourth semiconductor layers have the distortion in their shape in substantially equal proportion to the second semiconductor layers in any portion of the row regions if there is the deflection of the first semiconductor layer. Therefore, the area ratio between the third and fourth semiconductor layers is improved in its accuracy.

Preferably, the semiconductor device further comprises: a MOSFET provided at either side of the first semiconductor element or of the second semiconductor element on the major surface of the first semiconductor layer. The MOSFET comprises a well of the second conductivity type having a major surface which is formed simultaneously with the second semiconductor layer on the major surface of the first semiconductor layer, and a source and a drain both of the first conductivity type which are formed simultaneously with the third semiconductor layer and the plurality of fourth semiconductor layers at a predetermined region on the major surface of the well.

In the semiconductor device according to the present invention, reduction in manufacturing cost is achieved by manufacturing the first and second semiconductor elements and the MOSFET through the same masking step in the substantially same process.

Preferably, the well has the same shape and area as the second semiconductor layer, and the source and the drain have the same shape and area as the third semiconductor layer and the plurality of fourth semiconductor layers.

In the semiconductor device according to the present invention, a standard of the semiconductor layers is achieved. The semiconductor layers of the same shape prepared in advance can be used selectively for the third semiconductor layer or the fourth semiconductor layer according to a circuit design, thereby cutting the period from design to completion.

The present invention is also directed to a band gap reference power supply for obtaining a stabilized reference voltage in a semiconductor integrated circuit. According to the present invention, the band gap reference power supply comprises: a first transistor; a second transistor of which a base and a collector are in common with the first transistor and of which an emitter is predetermined number of times as large as an emitter of the first transistor; and an input means for applying a base voltage to the common base of the first and second transistors. The first transistor and the second transistor have a common collector layer having a major surface. The first transistor comprises at least one base layer having a major surface formed on the major surface of the collector layer; and at least one emitter layer formed by diffusion at a predetermined region on the major surface of the at least one base layer. The second transistor comprises at least one base layer having a major surface formed on the major surface of the collector layer; and a plurality of emitter layers formed by diffusion at a predetermined region on the major surface of the at least one base layer. A total area of the plurality of emitter layers of the second transistor is larger than a total area of the at least one emitter layer of the first transistor. The at least one emitter layer of the first transistor and the plurality of emitter layers of the second transistor are spaced with one another in at least one emitter row region. The at least one emitter of the first transistor is disposed between the plurality of emitter layers of the second transistor.

In the band gap reference power supply according to the present invention, since the emitter of the first transistor is not located on either end portion of the emitter row region in the longitudinal direction, the emitter of the first transistor has less distortion in its shape if there is deflection of the common collector due to a stress to cause distortion in shape of the emitters located on both end portions. Moreover, since the total area of the emitters of the second transistor is larger than that of the emitter of the first transistor, the distortion in shape of the emitters of the second transistor, if any, have less effect than the distortion in shape of the emitter of the first transistor. Therefore, the area ratio between the emitters of the first and second transistors has much less error.

Preferably, each of the plurality of emitters of the second transistor has the same shape and area as the emitter of the first transistor.

The emitters of the first and second transistors all of which are formed by diffusion have difficulty in obtaining the same area exactly as designed because of diffusion time and environmental conditions including temperature and humidity. In the band gap reference power supply according to the present invention, since the plurality of emitters of the second transistor are formed separately and each of them has the same shape and area as the emitter of the first transistor, the emitters of the first and second transistors have equal errors in their diffusion area if they have any. Therefore, it is possible to prevent the area ratio error between the emitters of the first and second transistors, and to achieve the area ratio between the emitters of the first and second transistors with higher accuracy.

Preferably, the number of the plurality of emitters of the second transistor is three times as large as the number of the at least one emitter of the first transistor or more.

In the band gap reference power supply according to the present invention, by preventing distortion in shape of the emitter of the first transistor, there is inevitable distortion in shape of the emitters of the second transistor. Since the number of the emitters of the second transistor is three times as large as the number of the at least one emitter of the first transistor or more and accordingly the total area of the emitters of the second transistor is three times as large as the total area of the at least one emitter of the first transistor or more, the distortion area of the emitters of the second transistor, if any, forms lower proportion of the total area thereof. Therefore, it is possible to achieve the area ratio between the emitters of the first and second transistors with high accuracy.

Preferably, the emitter of the first transistor is disposed between two halves of the plurality of emitters of the second transistor.

Since the emitter of the first transistor is located in the middle portion of the emitter row region away from the end portions, the emitter of the first transistor has much less distortion in shape if the common collector has deflection due to the stress.

Preferably, the at least one emitter row region includes a plurality of emitter row regions.

In the band gap reference power supply according to the present invention, when the corresponding emitters across the plurality of emitter row regions are connected, the emitters of the first and second transistors of larger areas are obtained, and internal resistances are lowered in applying a current to both transistors since the internal resistances are as if connected in parallel. Accordingly, the power consumption is lowered.

Preferably, the at least one base includes a plurality of bases and each of the plurality of bases is provided independently corresponding to the emitter of the first transistor or each of the plurality of emitters of the second transistor. Furthermore, the plurality of bases are of the same shape and area.

When there is deflection of the common collector due to the stress, there occurs thereby distortion in shape of the base provided on the major surface of the common collector to further cause distortion in shape of the emitters of the first and second transistors. In the band gap reference power supply according to the present invention, since the plurality of bases of the same shape and area are each formed independently corresponding to each of the emitters of the first or second transistors, the emitters of the first and second transistors have the distortion in their shape in substantially equal proportion to the bases in any portion of the emitter row regions if there is the deflection of the common collector. Therefore, the area ratio between the emitters of the first and second transistors is improved in its accuracy.

Preferably, the band gap reference power supply further comprises: a MOSFET provided at either side of the first transistor or of the second transistor on the major surface of the common collector layer. The MOSFET comprises a well having a major surface which is formed simultaneously with the base layer on the major surface of the collector layer, and a source and a drain which are formed simultaneously with the emitter layer of the first transistor and the plurality of emitter layers of the second transistor at a predetermined region on the major surface of the well.

In the band gap reference power supply according to the present invention, reduction in manufacturing cost is achieved by manufacturing the first and second semiconductor elements and the MOSFET through the same masking step in the substantially same process.

Preferably, the well has the same shape and area as the base, and the source and the drain have the same shape and area as the emitter of the first transistor and the plurality of emitters of the second transistor.

In the band gap reference power supply according to the present invention, a standard of the elements is achieved. The elements of the same shape prepared in advance can be used selectively for the emitter of the first transistor or the emitters of the second transistor according to a circuit design, thereby cutting the period from design to completion.

Accordingly, an object of the present invention is to provide a semiconductor device of monolithic type, in which at least one pair of transistors having emitters of different areas with predetermined ratio and common collector and base are connected in parallel, to achieve a dramatic improvement in accuracy of the emitter area ratio and a band gap reference power supply utilizing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

[The First Preferred Embodiment]

Figure 1:
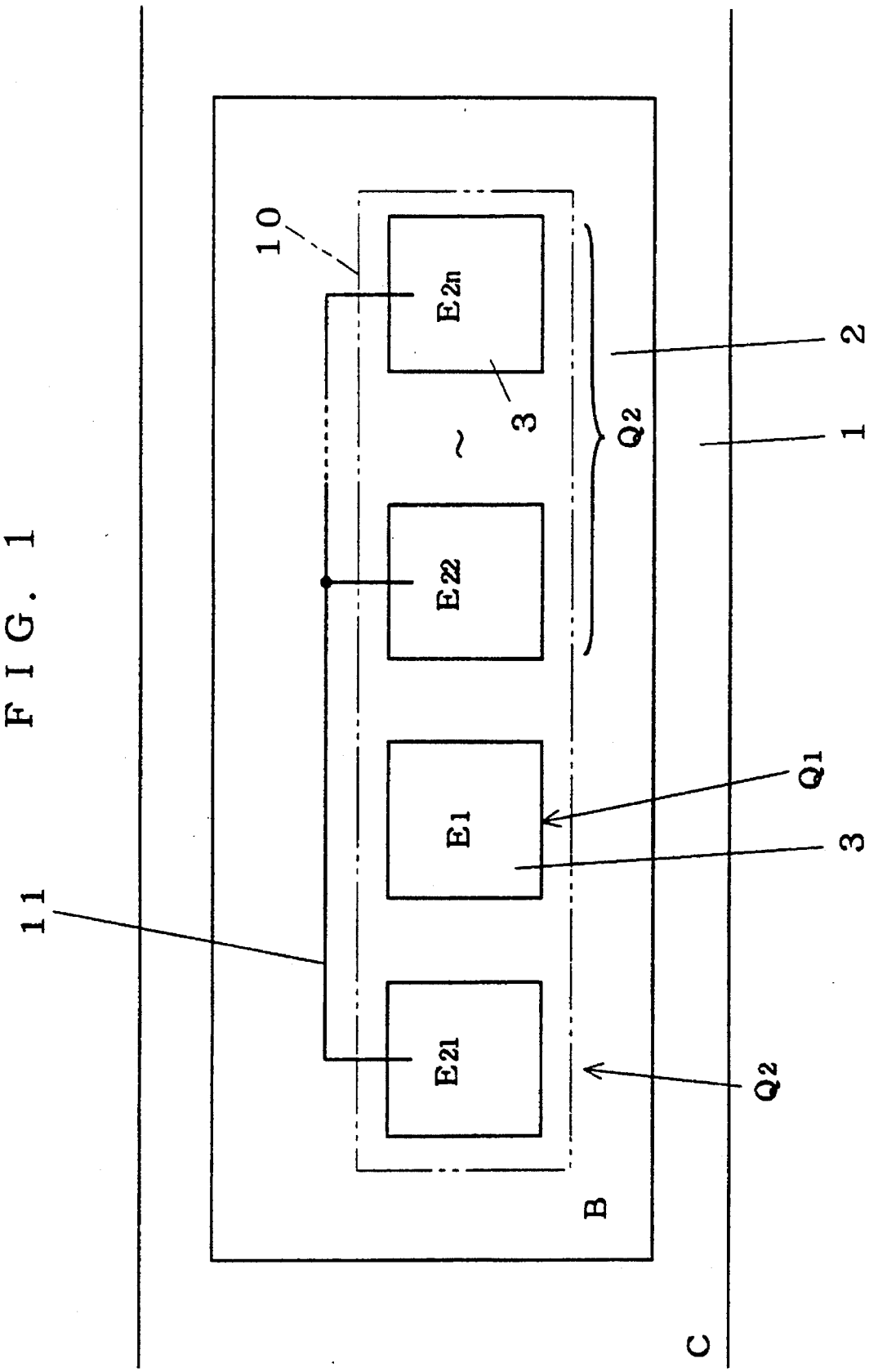
FIG. 1 is a plan view showing a layout of a semiconductor device in accordance with a first preferred embodiment of the present invention.
Figure 11:
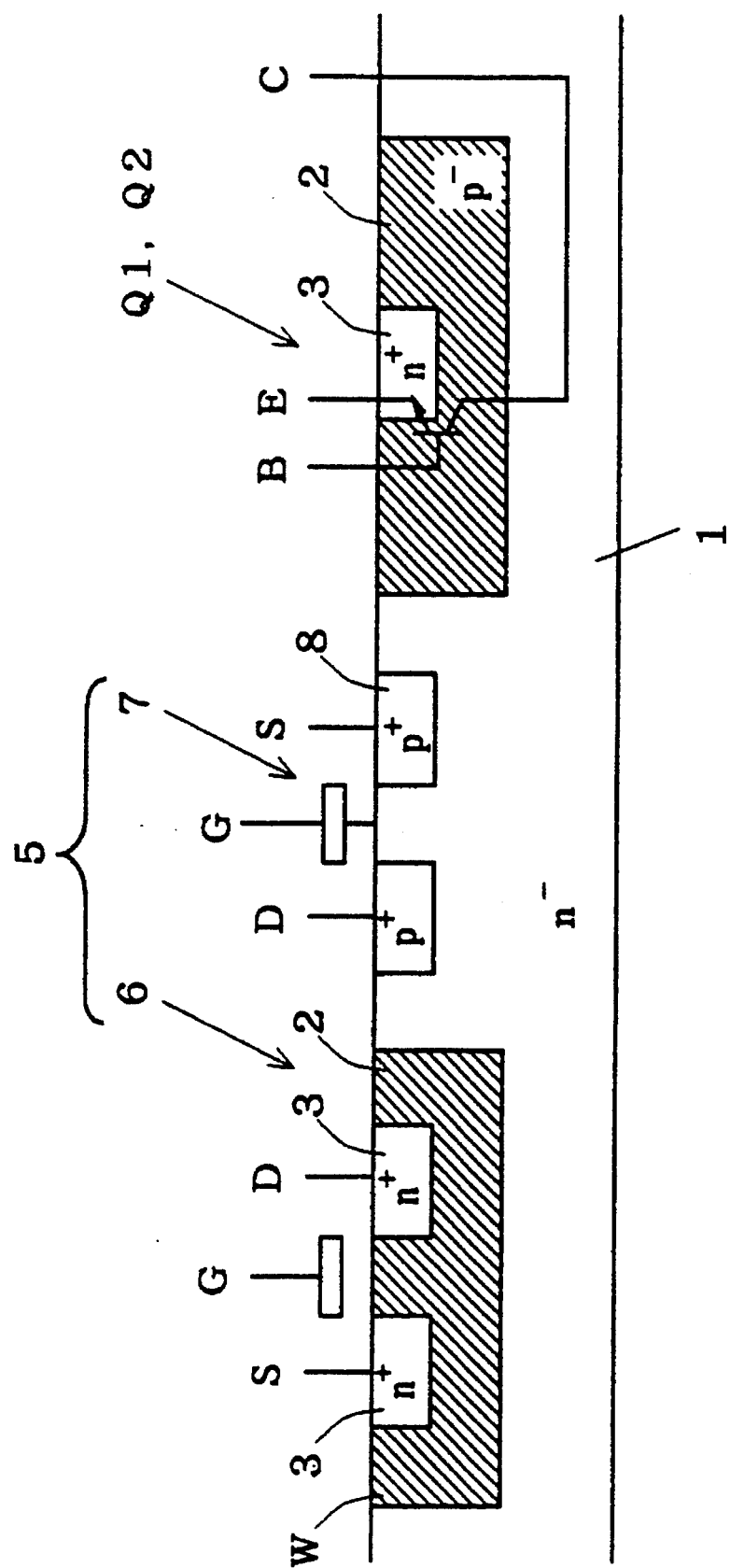
FIG. 11 is a sectional view showing a band gap reference power supply of CMOS confirmation.
Figure 12:
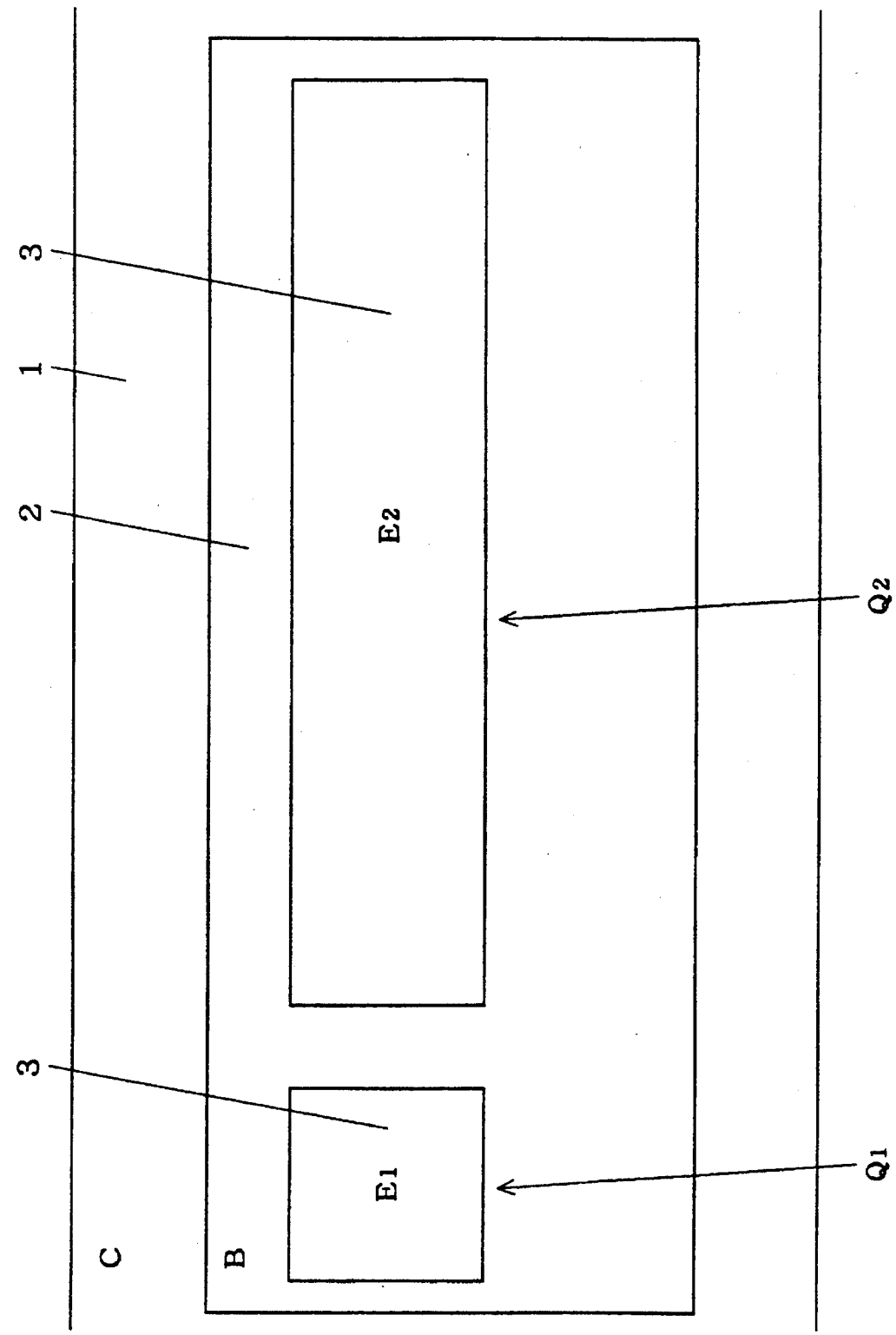
FIG. 12 is a plan view showing a layout of a semiconductor device in the second background art.

FIG. 1 is a plan view showing a layout of a semiconductor device in accordance with the first preferred embodiment of the present invention. Like members and elements are given the same reference numerals as in the background arts. The semiconductor device of the first preferred embodiment is used in, for example, the band gap reference power supply of FIG. 9, and comprises a pair of parasitic transistors (artificial bipolar transistors) Q1 and Q2 including an n⁻-type semiconductor layer 1 (the first semiconductor layer) serving as a collector, a p⁻-type diffused layer 2 (the second semiconductor layer) as a base and n⁺-type diffused regions 3 (the third semiconductor layer and the fourth semiconductor layer) as emitters. In manufacturing the CMOS as shown in FIG. 11, the first, second, and third and fourth semiconductor layers serve as a substrate, a well and a source S or a drain D, respectively. As shown in FIG. 1, the transistors Q1 and Q2 have the common n⁻-type semiconductor layer 1 which functions as a substrate, and accordingly constitute an emitter follower configuration with a common collector C. The transistors Q1 and Q2 further have a common base B.

The transistor Q1 (the first transistor) consists of an emitter E1 (the third semiconductor layer), the base B (the second semiconductor layer) and the collector C (the first semiconductor layer). In other words, the transistor Q1 is comprised of the n⁻-type semiconductor layer 1 (collector C) and a first semiconductor element including the base B and the emitter E1 layered thereon. The emitter E1 is controlled to have an area of predetermined value $S_{E1}$ in the n⁺ diffusion process.

The other transistor Q2 (the second transistor) consists of more than two emitters E21, E22, . . . , E2n (the fourth semiconductor layers), the base B (the second semiconductor layer) and the collector C (the first semiconductor layer). In other words, the transistor Q2 is comprised of the n⁻-type semiconductor layer 1 (the collector C) and a second semiconductor element including the base B and the emitters E21, E22, . . . , E2n layered thereon adjacent to the first semiconductor element.

Each of the emitters E21, E22, . . . , E2n has the same shape as the emitter E1, and has the same area as the emitter E1 on design, i.e., has the area $S_{E1}$. In this case, if an error occurs in the area $S_{E1}$ of the emitters E21, E22, . . . , E2n due to controlling error of the diffusion time and the like in the diffusion process, the emitters E1, E21, E22, . . . , E2n each have roughly equal area error $\delta$, and accordingly the total area errors (n×$\delta$) of the transistor Q2 is n times as large as the area error ($\delta$) of the transistor Q1. Therefore, even if the controlling error of the diffusion time and the like occurs, the total area taking errors into account of the emitters E21, E22, . . . , E2n of the transistor Q2 is (n×$S_{E1}$+n×$\delta$)=n×($S_{E1}$+$\delta$), i.e., n times as large as the area ($S_{E1}$+$\delta$) taking an error into account of the emitter E1 of the transistor Q1.

The emitter E1 of the transistor Q1 and the emitters E21, E22, . . . , E2n of the transistor 02 are aligned in a row (hereinafter, referred to as "emitter row 10"), keeping such a spacing between adjacent emitters that the withstand voltage therebetween can be maintained. The emitters E21, E22, . . . , E2n of the transistors Q2 are connected in parallel to one another by a general wiring pattern 11 made by sputtering and the like.

Although the first preferred embodiment shows that each of the emitters E1, E21, E22, . . . , E2n is square-shaped from plan view, another shape may be allowed such as substantial square with the corners rounded, rectangle, parallelogram, substantial rectangle with the corners rounded, substantial parallelogram with the corners rounded, circle, ellipse, triangle and the like. The source and drain of the CMOS 5 as shown in FIG. 11 which are formed simultaneously with the transistors Q1 and Q2 in a process have the same shape as above. Furthermore, the CMOS 5 is a constituent of the operational amplifier A1 (input means) of FIG. 9.

As shown in FIG. 1, the emitters E21 and E2n of the transistor Q2 are disposed on both ends of the emitter row 10 consisting of the emitter E1 of the transistor Q1 and the emitters E21, E22, . . . , E2n of the transistor Q2, and the emitter E1 is disposed between the emitters E21 and E2n, specifically, at an inside portion of the emitter row 10 adjacent to the emitter E21. Even if the substrate (n⁻-type semiconductor layer 1) and the like has deflection due to a stress to cause distortion in shape of the emitters in the emitter row 10, the emitter E1 of the transistor Q1, which is not disposed on either end, has much less distortion in shape than the emitters E21 and E2n disposed on both ends in the emitter row 10.

Assuming now that the area of the emitter E1 of the transistor Q1 is $S_{E1}$ and the total area of the emitters E21, E22, . . . , E2n is $S_{E2}$, the desired $S_{E2}$ is obtained by n×$S_{E1}$. Since the emitters E21 and E2n located on both ends have distortion in their shape, on condition that the other emitters have no distortion and no change of areas, each area of the emitters E21 and E2n is (1−β) times as large as each area of the other emitters (where 0<β<<1). Accordingly, the emitter area ratio $S_{E1}$:$S_{E2}$ between the transistors Q1 and Q2 in the configuration of FIG. 1 is expressed as follows:

$$S_{E1}:S_{E2} = 1: \frac{S_{E2}}{S_{E1}} = \frac{(n-2)S_{E1} + 2(1-\beta)S_{E2}}{S_{E1}} \quad (11)$$

$$= n - 2\beta = n + \epsilon rr2$$

where err2 is an error element due to the distortion in shape.

Figure 2:
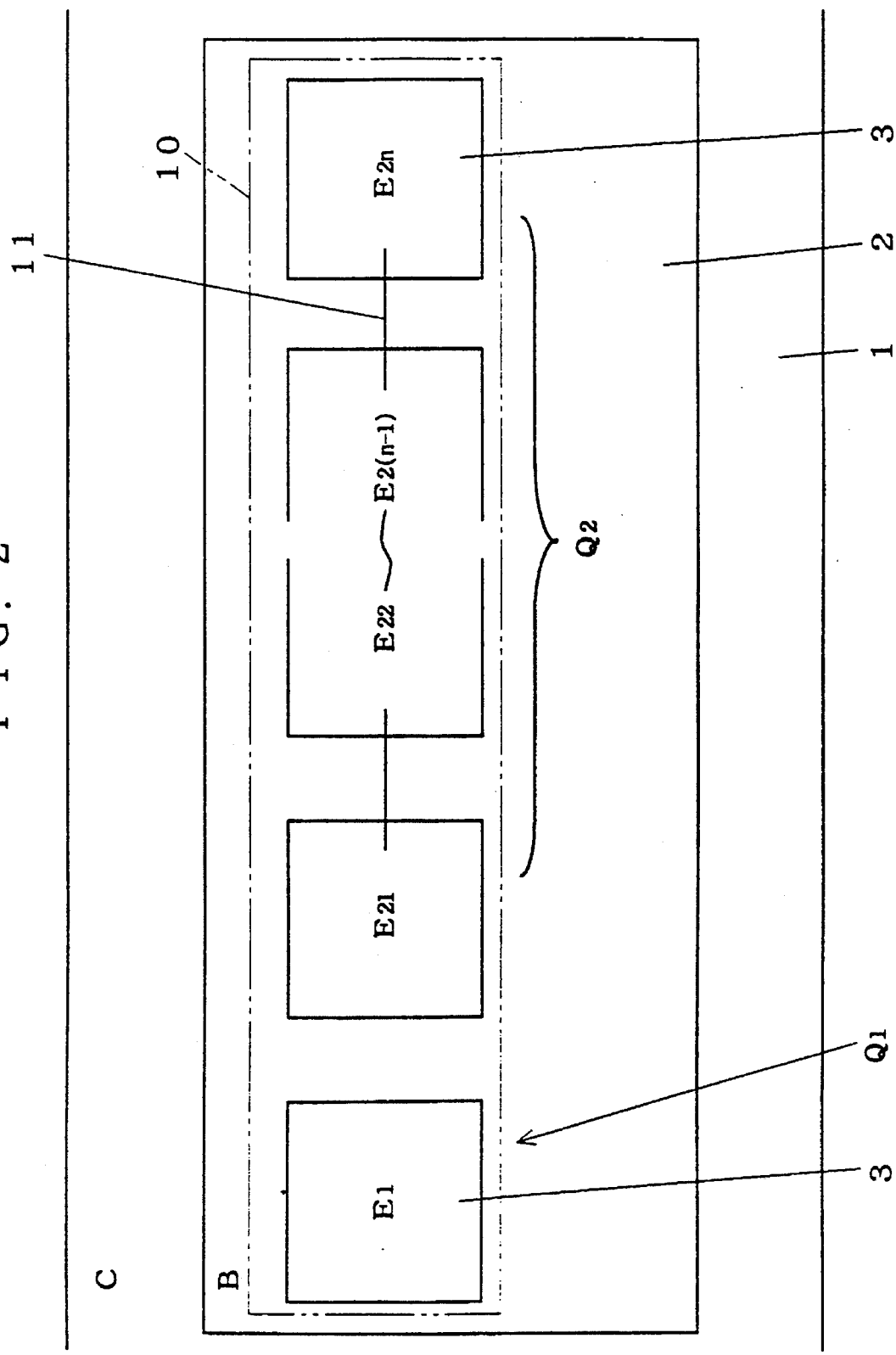
FIG. 2 is a plan view showing a layout of a semiconductor device in accordance with a proposed example.

FIG. 2 shows a proposed example of a semiconductor device in which the transistor Q2 includes n emitters E21, E22, ..., E2n each having the substantially same area as the emitter E1 of the transistor Q1 and the emitter E1 of the transistor Q1 is disposed on one end of the emitter row 10. Assuming that an error element due to the distortion in shape is err1, the following relation is hold:

$$S_{E1}:S_{E2} = 1: \frac{S_{E2}}{S_{E1}} = \frac{(n-1)S_{E1} + (1-\beta)S_{E1}}{(1-\beta)S_{E1}} \quad (12)$$

$$= \frac{n-\beta}{1-\beta} = n + \frac{\beta}{1-\beta}(n-1) = n + \epsilon rr1$$

When an error element err2 of the first preferred embodiment is smaller than the error element err1 of the proposed example of FIG. 2, it is found that the first preferred embodiment ensures an area accuracy which is superior to that in the proposed example. A difference between the error elements err1 and err2 is obtained by calculation as follows:

$$|\epsilon rr1| - |\epsilon rr2| = \frac{\beta}{1-\beta}(n-1) - 2\beta \quad (13)$$

$$= \frac{\beta}{1-\beta}(n-3+2\beta)$$

Since $n \geq 3$ and $0 < \beta \ll 1$ as mentioned above, the following inequality is obtained:

$$\beta > \frac{3-n}{2} \quad (14)$$

$$\therefore n - 3 + 2\beta > 0$$

$$\therefore \frac{\beta}{1-\beta}(n-3+2\beta) > 0$$

As clearly seen from Formulae (13) and (14), the error element err2 of the first preferred embodiment is smaller than the error element err1 of the proposed example of FIG. 2. Accordingly, when the semiconductor device of the first preferred embodiment is used in, for example, the band gap reference power supply of FIG. 9, the desired emitter area ratio (1:n) between the transistors Q1 and Q2 achieved with accuracy, thereby obtaining the desired base-emitter voltage difference $\Delta V_{BE}$ between the transistors Q1 and Q2 also with accuracy.

In manufacturing the semiconductor device, as shown in FIG. 11, p⁻ ions are implanted into a predetermined position of a main surface (upper surface) of the n⁻-type semiconductor layer 1, through annealing and diffusion, to form the p⁻-type diffused layer 2 which functions as a well. In the process, the bases B of the transistors Q1 and Q2 and the well W of the CMOS 5 adjacent thereto are formed simultaneously as shown in FIG. 11. Furthermore, the bases of the transistors Q1 and Q2 and the well W of the CMOS 5 have the same shape and area. After that, n⁺ ions are implanted into a predetermined position of a main surface (upper surface) of the p⁻-type diffused layer 2, through annealing and diffusion, to form the n⁺-type diffused region 3. In the process, the emitters E1, E21, E22, ..., E2n of the transistors Q1 and Q2 and the source S and drain D of the CMOS 5 are formed simultaneously. Furthermore, the source S and drain D of the CMOS 5 in the operational amplifier A1 (input means) and the emitters E1, E21, E22, ..., E2n of the transistors Q1 and Q2 have the same shape and area.

Since the transistors Q1 and Q2 are simultaneously formed in the manufacturing process of the CMOS 5, speed-up in manufacturing process and reduction in manufacturing cost are accomplished. Since the source S and drain D of the CMOS 5 and the emitters E1, E21, E22, ..., E2n of the transistors Q1 and Q2 have the same shape and area, a standard of the semiconductor layers is achieved. The semiconductor layers of the same shape prepared in advance can be used selectively for any emitter of the transistors according to a circuit design in manufacturing a circuit. Therefore, it is possible to cut the period from design to completion.

[The Second Preferred Embodiment]

Figure 3:
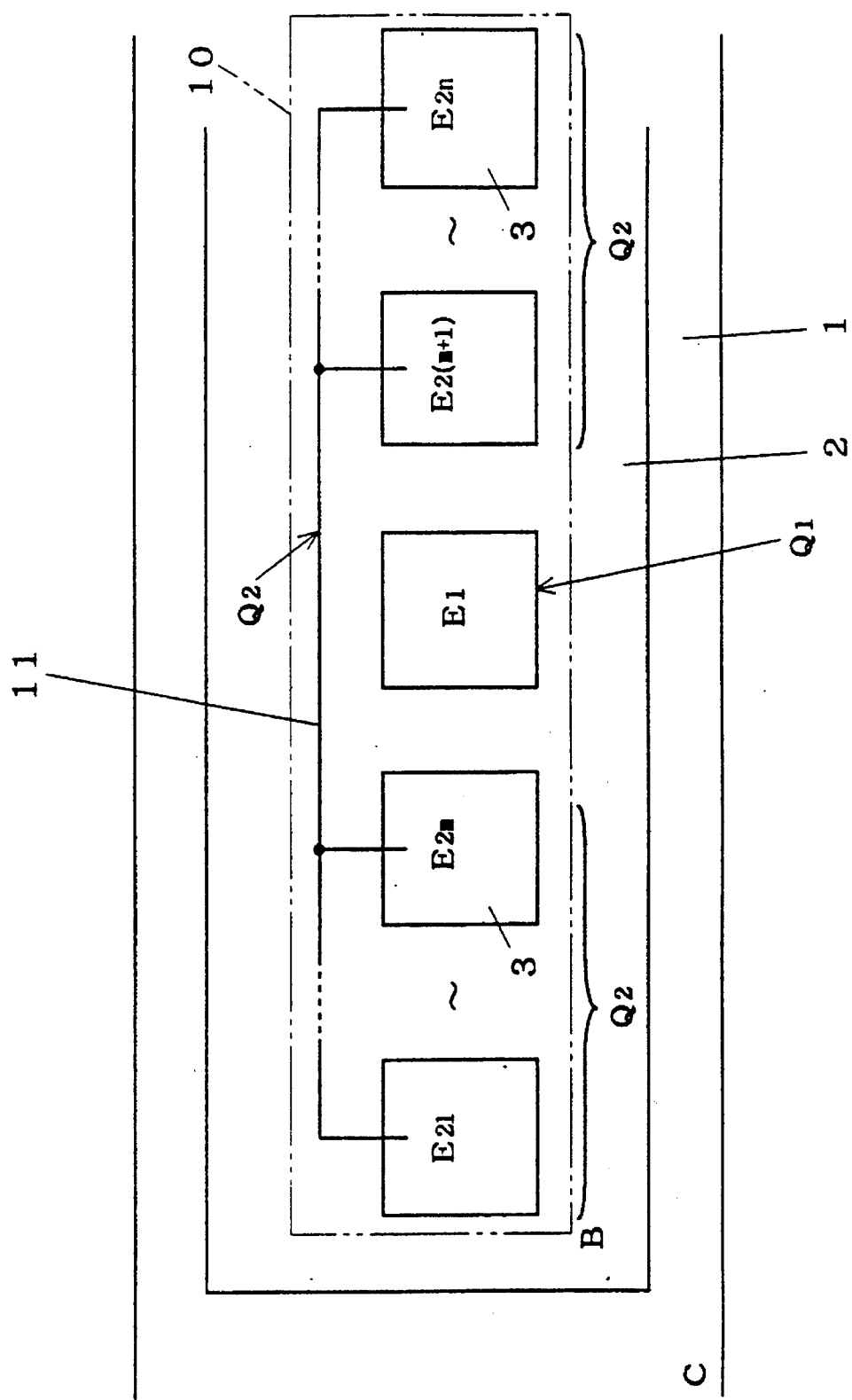
FIG. 3 is a plan view showing a layout of a semiconductor device in accordance with a second preferred embodiment of the present invention.

FIG. 3 is a plan view showing a layout of a semiconductor device in accordance with the second preferred embodiment of the present invention. In the first preferred embodiment, the emitter E1 of the transistor Q1 is located at an inside portion adjacent to the emitter E21 of the transistor Q2 located on the one end in the emitter row 10. In this case, when there is heavy deflection of the substrate and thereby distortion in shape occurs even further inside, the emitter E1 may not be completely prevented from distortion in shape.

In the second preferred embodiment, the emitter E1 of the transistor Q1 is disposed on almost middle portion of the emitter row 10 away from both ends thereof to be completely prevented from distortion in shape. More specifically, the emitter E1 is disposed between m emitters E21 to E2m (m is almost ½ n) and the rest (n–m) emitters E2(m+1) to E2n. The emitter E1 is the (m+1)th emitter from the one end of the emitter row 10. When n is an even number, m=½ n, and when n is an odd number, m=½ (n–1).

In this configuration, even if there is heavy deflection of the substrate, the middle portion has little distortion in shape because of symmetrical deflection on the right and left sides, so that distortion in shape of the emitter E1 is completely prevented. Therefore, the second preferred embodiment ensures the desired emitter area ratio (1:n) between the transistors Q1 and Q2 with higher accuracy as compared with the first preferred embodiment, and accordingly, ensures the desired base-emitter voltage difference $\Delta V_{BE}$ between the transistors Q1 and Q2.

Figure 9:
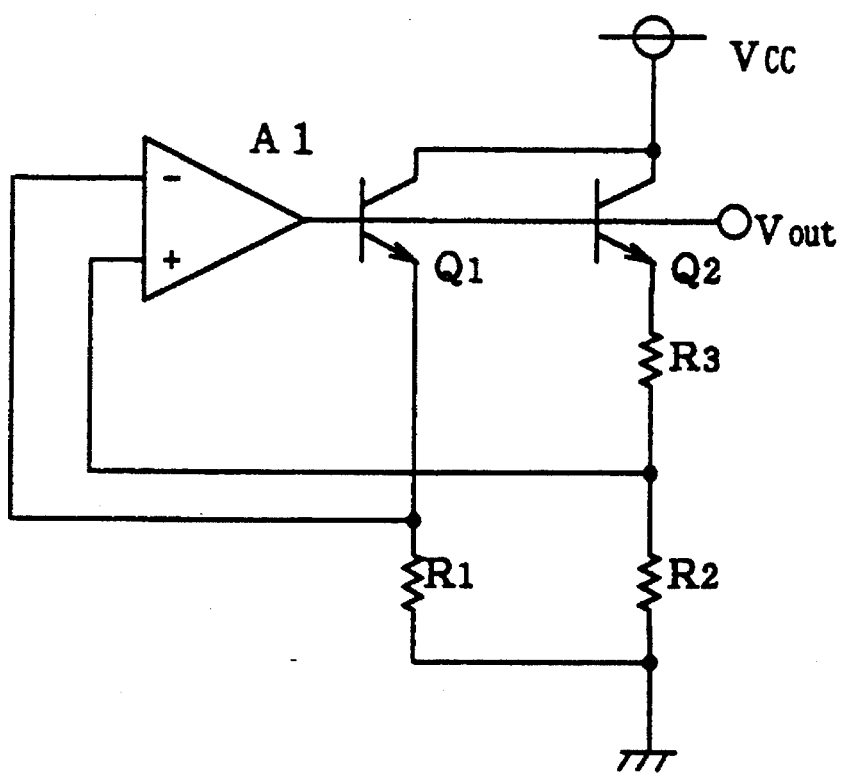
FIG. 9 is a circuit diagram of a band gap reference power supply using an operational amplifier in accordance with a second background art.
Figure 10:
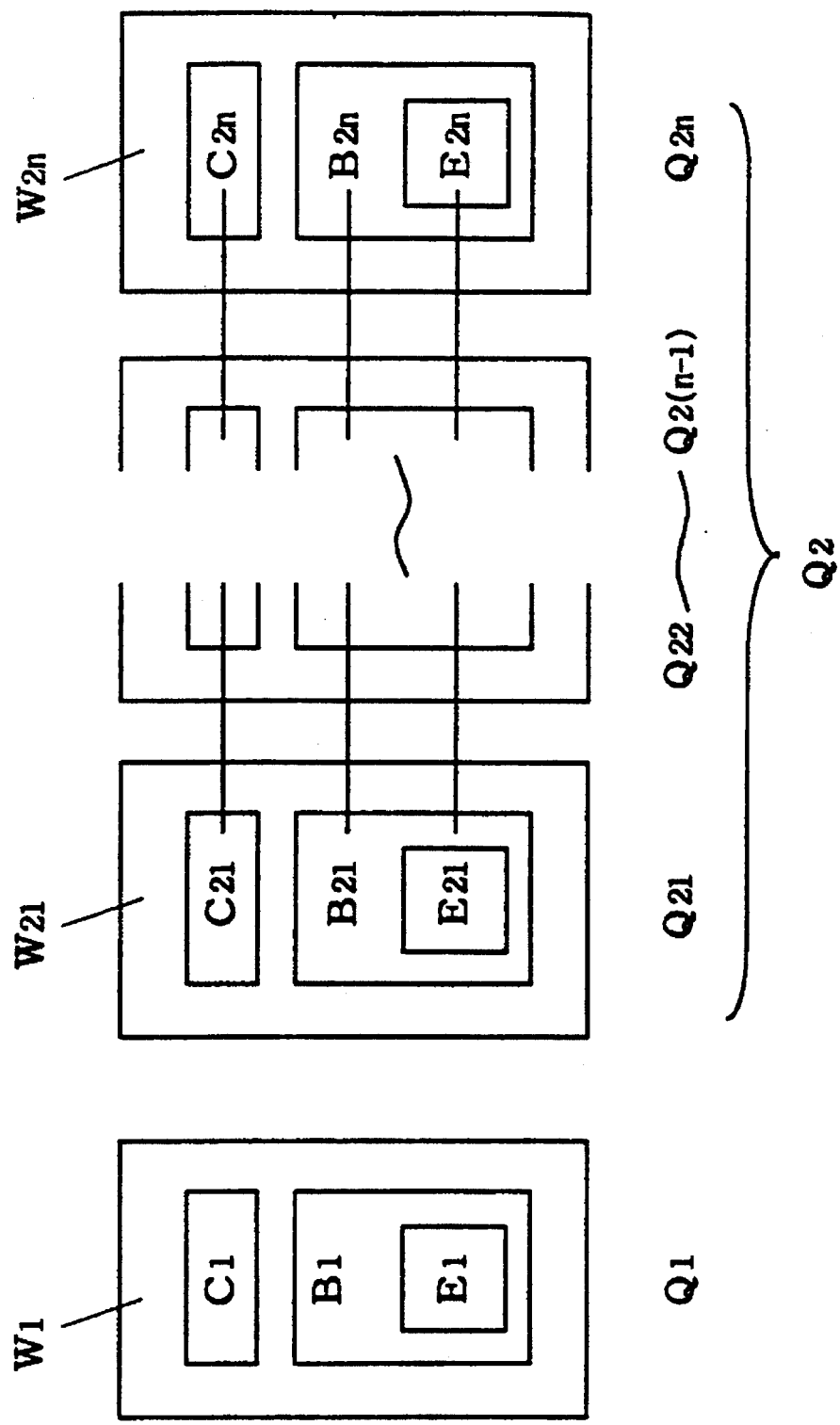
FIG. 10 is a plan view showing a layout of a semiconductor device in accordance with back ground arts.

The configuration, manufacturing method, function and effect of the second preferred embodiment other than the above are the same as those of the first preferred embodiment. Particularly, like the first preferred embodiment, the semiconductor device of the second preferred embodiment can be used in the band gap reference power supply, for example, as shown in FIG. 9.

[The Third Preferred Embodiment]

Figure 4:
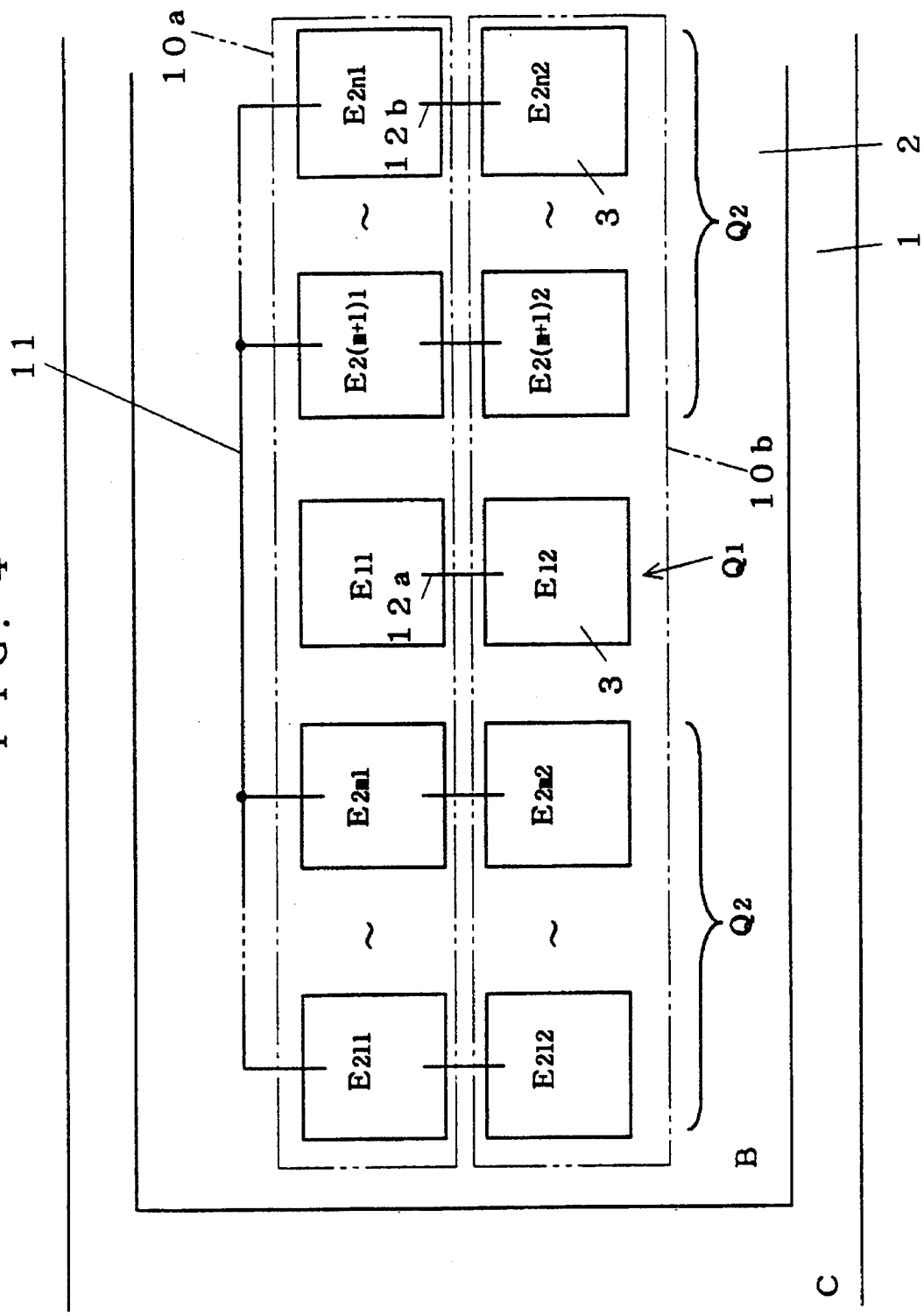
FIG. 4 is a plan view showing a layout of a semiconductor device in accordance with third preferred embodiment of the present invention.

FIG. 4 is a plan view showing a layout of a semiconductor device in accordance with the third preferred embodiment of the present invention. The semiconductor device of the third preferred embodiment includes two emitter rows 10a and 10b unlike the first and second preferred embodiments so as to reduce the internal resistances of the transistors Q1 and Q2 and enlarge the emitter areas at the same rate.

The transistor Q1 has two emitters E11 and E12 on the respective emitter rows, and the transistor Q2 has 2×n emitters, i.e. n emitters E211 to E2n1 on one row 10a and n emitters E212 to E2n2 on the other emitter row 10b. The emitters E11 and E12 of the transistor Q1 are electrically connected with each other through a wiring pattern 12a. Corresponding emitters of the transistor Q2 across the rows, E211 and E212, ... , E2m1 and E2m2, E2(m+1)1 and E2(m+1)2, ... , E2n1 and E2n2 are electrically connected with each other, respectively, through wiring patterns 12b. In addition, the emitters E211, ... , E2n1 of the transistor Q2 on the first emitter row 10a are electrically connected with one another through a wiring pattern 11. All the emitters E211 to E2n2 of the transistor Q2 are thereby electrically connected with one another.

The emitter E11 of the transistor Q1 is disposed between m emitters (almost half of the emitters of the transistor Q2 in the same row) E211 to E2m1 and the rest (n–m) emitters E2(m+1)1 to E2n1. Similarly, the other emitter E12 of the transistor Q1 is disposed between m emitters (almost half of the emitters of the transistor Q2 in the same row) E212 to E2m2 and the rest (n–m) emitters E2(m+1)2 to E2n2.

The internal resistances of the transistors Q1 and Q2 are reduced inversely proportional to the areas thereof. Specifically the areas of the transistors Q1 and Q2 are each doubled and the internal resistances thereof are each reduced to their half.

The configuration and effect of the third preferred embodiment other than the above are the same as those of the second preferred embodiment. Particularly like the second preferred embodiment, the semiconductor device of the third preferred embodiment can be used in the band gap reference power supply, for example, as shown in FIG. 9.

[The Fourth Preferred Embodiment]

Figure 5:
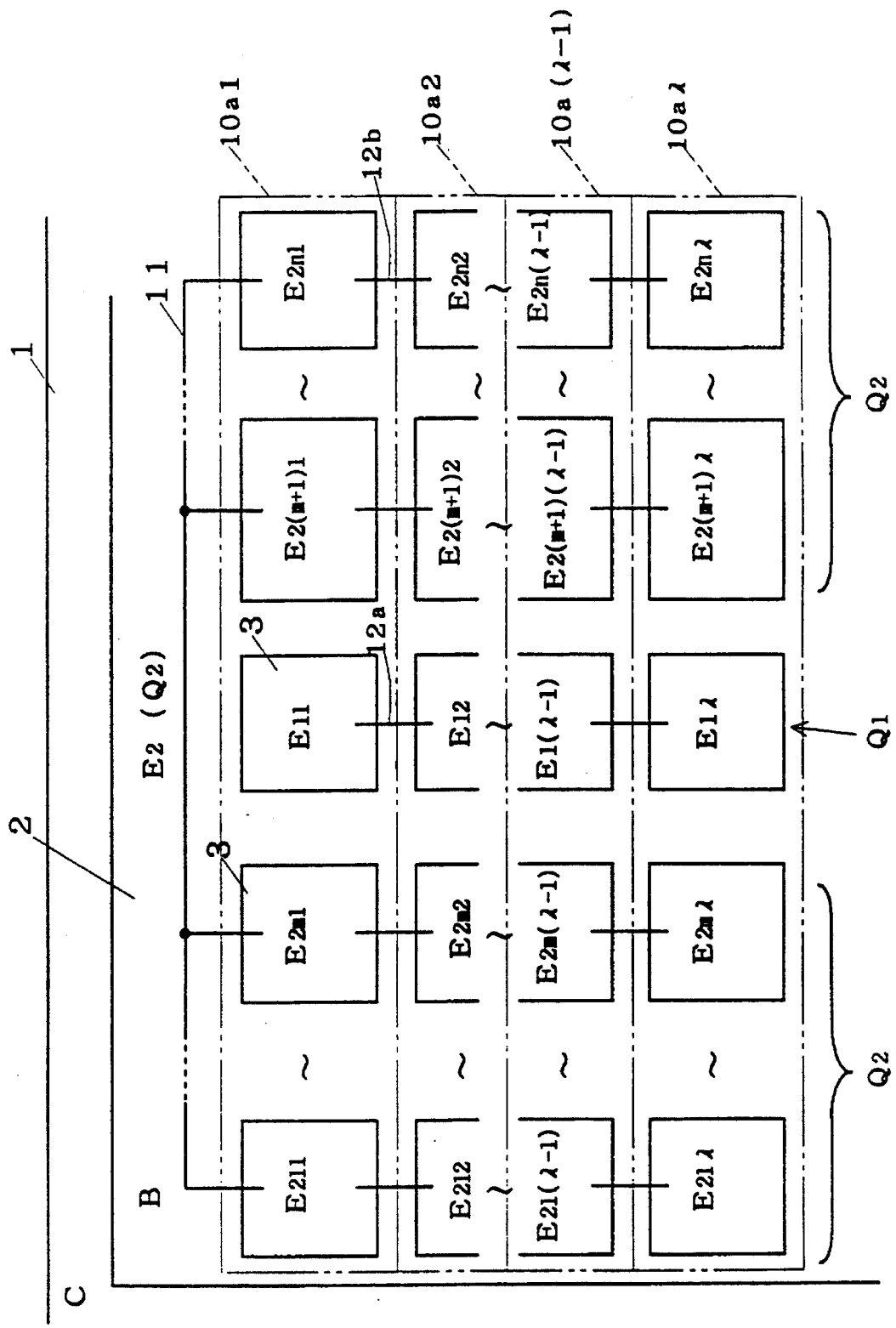
FIG. 5 is a plan view showing a layout of a semiconductor device in accordance with a fourth preferred embodiment of the present invention.

FIG. 5 is a plan view showing a layout of a semiconductor device in accordance with the fourth preferred embodiment of the present invention. The semiconductor device of the fourth preferred embodiment includes more than two emitter rows 10a1 to 10aλ unlike the third preferred embodiment so as to further reduce the internal resistances of the transistors QI and Q2 and enlarge the emitter areas at the same rate.

The transistor Q1 has one emitter on each emitter row, and accordingly has totally λ emitters E11, E12, ... , E1λ. The transistor Q2 has n emitters on each emitter row, e.g., n emitters E211 to E2n1 on the first emitter row 10a1 and n emitters E21λ to E2nλ on the λ-th emitter row, and accordingly has totally (λ×n) emitters.

The emitters E11, E12, ... , E1λ of the transistor Q1 are electrically connected with one another through a wiring pattern 12a. Corresponding emitters of the transistor Q2 across the emitter rows, E211 to E21λ, ... , E2m1 to E2mλ, E2(m+1)1 to E2(m+1)λ, ... , E2n1 to E2nλ are electrically connected with one another, respectively, through wiring patterns 12b. In addition, the emitters E211, ... , E2 n1 of the transistor Q2 on the first emitter row 10a1 are electrically connected with one another through a wiring pattern 11. All the emitters E211 to E2nλ of the transistor Q2 are thereby electrically connected with one another.

The emitters E11, E12, ... , E1λ of the transistor Q1 are each disposed between m emitters (almost half of the emitters of the transistor Q2 in the respective rows) E211 to E2m1, E212 to E2m2, ... , E2λ to E2mλ and the rest (n–m) emitters E2(m+1)1 to E2n1, E2(m+1)2 to E2n2, ... , E2(m+1)λ to E2nλ.

The internal resistances of the transistors Q1 and Q2 are reduced inversely proportional to the areas thereof. Specifically, the areas of the transistors Q1 and Q2 are each enlarged by λ times and the internal resistances thereof are each reduced by a factor of λ.

The effect of the fourth preferred embodiment other than the above is the same as that of the second preferred embodiment. Particularly, like the second preferred embodiment, the semiconductor device of the fourth preferred embodiment can be used in the band gap reference power supply, for example, as shown in FIG. 9.

[The Fifth Preferred Embodiment]

Figure 6:
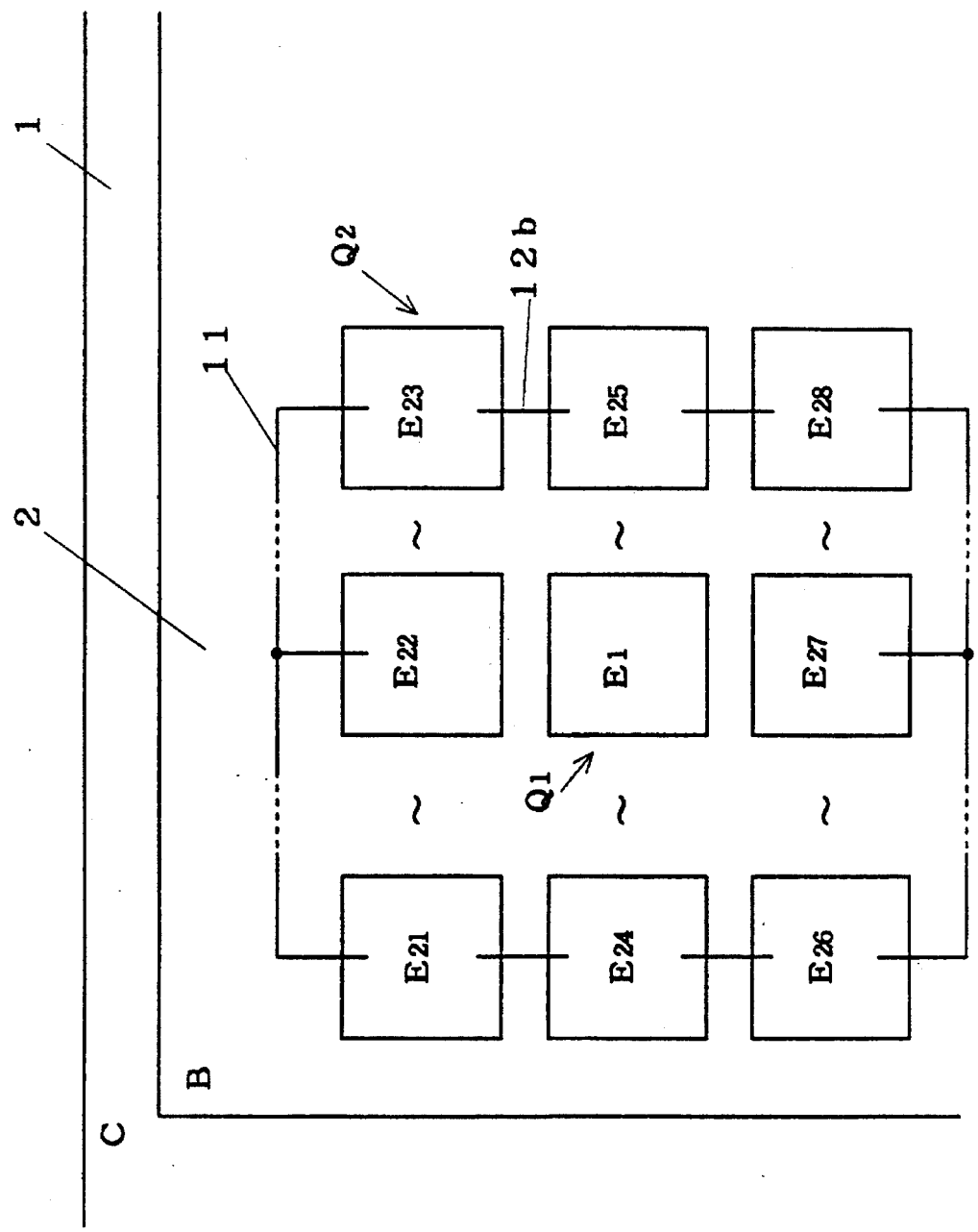
FIG. 6 is a plan view showing a layout of a semiconductor device in accordance with a fifth preferred embodiment of the present invention.

FIG. 6 is a plan view showing a layout of a semiconductor device in accordance with the fifth preferred embodiment of the present invention. In the fifth preferred embodiment, the emitter E1 of the transistor Q1 is located at the center both in length and breadth.

Specifically, the emitters E21 to E28 of the transistor Q2 are so disposed as to draw a box around on the base B of substantial square from plan view which functions as a well and the emitter E1 of the transistor Q1 is disposed at the center portion enclosed by the box of the emitters E21 to E28 of the transistor Q2. In this configuration, the emitter E1 is not located on any end portion in either rows or columns, thereby achieving the area of the emitter E1 with high accuracy.

The configuration and effect of the fifth preferred embodiment other than the above are the same as those of the three and fourth preferred embodiments. Particularly, like the fourth preferred embodiment, the semiconductor device of the fifth preferred embodiment can be used in the band gap reference power supply, for example, as shown in FIG. 9.

Although a 3 by 3 matrix of emitters is shown in the fifth preferred embodiment, as a matter of course, a matrix of emitters with more rows and more columns may be used.

[The Sixth Preferred Embodiment]

Figure 7:
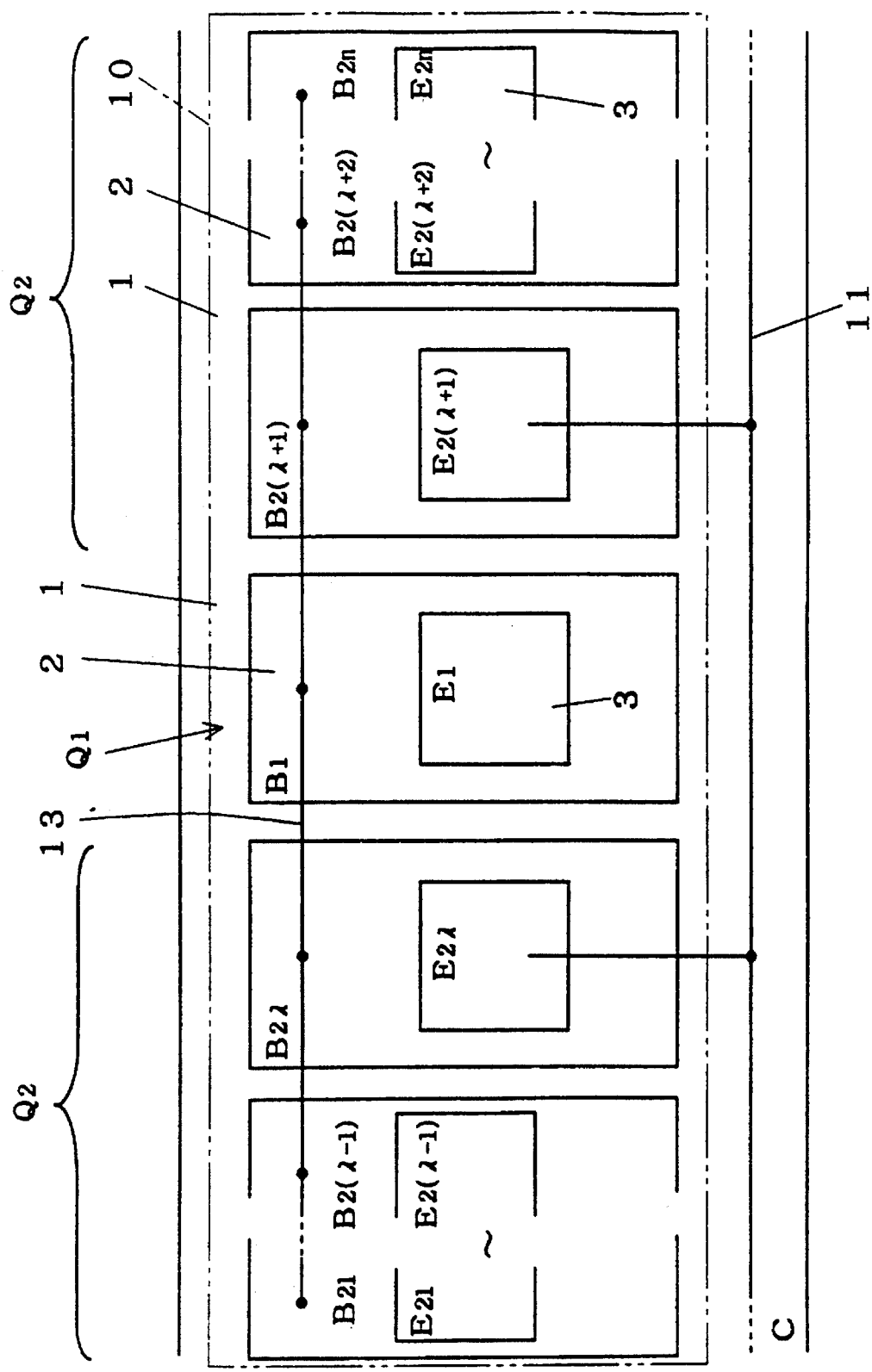
FIG. 7 is a plan view showing a layout of a semiconductor device in accordance with a sixth preferred embodiment of the present invention.
Figure 8:
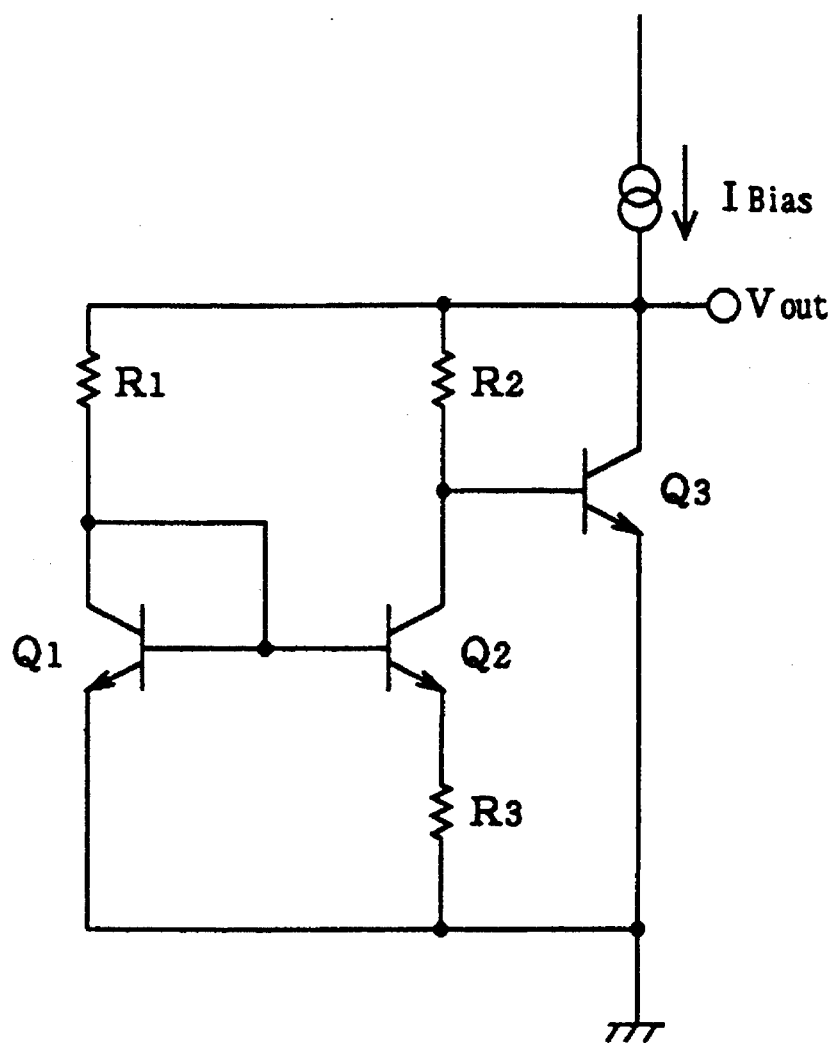
FIG. 8 is a basic circuit diagram of a band gap reference power supply in accordance with a first background art.

FIG. 7 is a plan view showing a layout of a semiconductor device in accordance with the sixth preferred embodiment of the present invention. In the sixth preferred embodiment, bases B21 to B2λ, B1, B2(λ+1) to B2n are provided separately corresponding to the emitters E21 to E2λ, E1, E2(λ+1) to E2n, respectively, and the adjacent bases are spaced with each other.

In the first to fifth preferred embodiments, the separate emitters are provided on a base which functions as a well, so that the emitters experience no little stress from the interface between the well and collector regions. When a plurality of emitters are provided in a base region, differences in position of the emitters could lead to differences (errors) in shape of the emitters.

In this preferred embodiment, bases B21 to B2λ, B1, B(λ+1) to B2n serving as wells are provided corresponding to the emitters E21 to E2λ, E1, E(λ+1) to E2n, respectively, so that all the emitters experience even stress from the base region. Therefore, not only emitter area ratio between the transistors Q1 and Q2 but also base area ratio therebetween is obtained with higher accuracy.

Moreover, since the emitter E1 and the base B1 of the transistor Q1 are located at the middle portion of the emitter row 10 (or base row 10), if there is deflection of the substrate due to a stress, both the emitter area and the base area are obtained with higher accuracy as compared with the case where the emitter E1 and the base B1 of the transistor Q1 are located at an end portion. In FIG. 7, the reference numeral 13 denotes a wiring pattern to connect all the bases B1, B21 to B2n of the transistors Q1 and Q2.

The configuration and effect of the sixth preferred embodiment other than the above are the same as those of the first preferred embodiment. Particularly, like the first preferred embodiment, the semiconductor device of the sixth preferred embodiment can be used in the band gap reference power supply, for example, as shown in FIG. 9. Furthermore, FIG. 7 shows the use of the emitter row 10 by way of example, and the sixth preferred embodiment may use a plurality of emitter rows like the third to fifth preferred embodiments.

[Variation]

(1) In the first preferred embodiment, although one emitter E1 is shown, a plurality of emitters E1 of the transistor Q1 may be provided in an emitter row.

(2) Although it has been described in detail that the semiconductor devices of the first to sixth preferred embodiments should be used in the band gap reference power supply of FIG. 9, the semiconductor devices may be used in any other circuits as a component.

(3) Although an NPN transistor is taken by way of example to describe the semiconductor devices of the first to sixth preferred embodiments, a PNP transistor may be used.

While the invention has been shown and described in detail, the foregoing description is in all aspects illustrative and not restrictive. It is therefore understood that numerous modifications and variations can be devised without departing the scope of the invention.

I claim:

1. A band gap reference power supply for obtaining a stabilized reference voltage in a semiconductor integrated circuit, comprising:

a first transistor;

a second transistor of which a base and a collector are in common with said first transistor and of which an emitter is a predetermined number of times as large as an emitter of said first transistor; and an input means for applying a base voltage to the common base of said first and second transistors, wherein said first transistor and said second transistor have a common collector layer having a major surface, said first transistor comprises at least one base layer having a major surface formed on said major surface of said collector layer; and at least one emitter layer formed by diffusion at a predetermined region on said major surface of said at least one base layer, said second transistor comprises at least one base layer having a major surface formed on said major surface of said collector layer; and a plurality of emitter layers formed by diffusion at a predetermined region on said major surface of said at least one base layer, a total area of said plurality of emitter layers of said second transistor is larger than a total area of said at least one emitter layer of said first transistor, said at least one emitter layer of said first transistor and said plurality of emitter layers of said second transistor are spaced with one another in at least one emitter row region, said at least one emitter layer of said first transistor is disposed between said plurality of emitter layers of said second transistor.

2. The band gap reference power supply of claim 1, wherein said total area of said plurality of emitter layers of said second transistor is at least three times as large as said total area of said at least one emitter layer of said first transistor.

3. The band gap reference power supply of claim 1, wherein said at least one emitter layer of said first transistor is disposed at a middle portion of said at least one emitter row region.

4. The band gap reference power supply of claim 1, wherein each of said plurality of emitter layers of said second transistor has a same shape and area as said at least one emitter layer of said first transistor.

5. The band gap reference power supply of claim 4, wherein a number of said plurality of emitter layers of said second transistor is at least three times as large as a number of said at least one emitter layer of said first transistor.

6. The band gap reference power supply of claim 4, wherein said at least one emitter layer of said first transistor is disposed between two halves of said plurality of emitter layers of said second transistor.

7. The band gap reference power supply of claim 4, wherein said at least one emitter row region includes a plurality of emitter row regions.

8. The band gap reference power supply of claim 4, wherein said at least one emitter row region includes only one emitter row region.

9. The band gap reference power supply of claim 4, wherein said at least one base layer includes a plurality of base layers, each of said plurality of base layers is provided independently corresponding to at least one of said at least one emitter layer of said first transistor and each of said plurality of emitter layers of said second transistor, and said plurality of base layers are of a same shape and area.

10. The band gap reference power supply of claim 4, wherein said at least one base layer includes only one base layer.

11. The band gap reference power supply of claim 4, further comprising:

a MOSFET provided at either side of said first transistor or of said second transistor on said major surface of said common collector layer, wherein said MOSFET comprises a well having a major surface which is formed simultaneously with said at least one base layer on said major surface of said collector layer, and a source and a drain which are formed simultaneously with said at least one emitter layer of said first transistor and said plurality of emitter layers of said second transistor at a predetermined region on said major surface of said well.

12. The band gap reference power supply of claim 11, wherein said well has the a same shape and area as said at least one base layer of said first transistor and said second transistor, and said source and said drain have a same shape and area as said at least one semiconductor layer and said plurality of emitter layers of said second transistor.

* * * * *